(12) United States Patent
Wu et al.

(10) Patent No.: US 8,338,934 B2
(45) Date of Patent: Dec. 25, 2012

(54) EMBEDDED DIE WITH PROTECTIVE INTERPOSER

(75) Inventors: Albert Wu, Palo Alto, CA (US); Scott Wu, San Jose, CA (US)

(73) Assignee: Marvell World Trade Ltd., St. Michael (BB)

(*) Notice: Subject to any disclaimer, the term of this patent is extended or adjusted under 35 U.S.C. 154(b) by 19 days.

(21) Appl. No.: 13/049,550

(22) Filed: Mar. 16, 2011

(65) Prior Publication Data

US 2011/0227223 A1 Sep. 22, 2011

Related U.S. Application Data

(60) Provisional application No. 61/315,319, filed on Mar. 18, 2010.

(51) Int. Cl.
 *H01L 23/22* (2006.01)
(52) U.S. Cl. ...................................... 257/687
(58) Field of Classification Search .................. 257/687
 See application file for complete search history.

(56) References Cited

U.S. PATENT DOCUMENTS

| 6,344,682 | B1 | 2/2002 | Tomita | |
|---|---|---|---|---|
| 6,506,633 | B1 | 1/2003 | Cheng et al. | |
| 7,189,593 | B2 * | 3/2007 | Lee | 438/107 |
| 7,202,556 | B2 * | 4/2007 | 'Khng et al. | 257/687 |
| 7,872,343 | B1 * | 1/2011 | Berry | 257/687 |
| 2009/0057871 | A1 * | 3/2009 | Zhao et al. | 257/693 |
| 2009/0244873 | A1 * | 10/2009 | Lu et al. | 361/808 |
| 2010/0117212 | A1 * | 5/2010 | Corisis et al. | 257/686 |
| 2010/0148316 | A1 | 6/2010 | Kim et al. | |

FOREIGN PATENT DOCUMENTS

WO WO2010057808 A1 5/2010

* cited by examiner

*Primary Examiner* — Charles Garber
*Assistant Examiner* — Andre' C Stevenson

(57) ABSTRACT

Embodiments of the present disclosure provide a substrate having (i) a first laminate layer, (ii) a second laminate layer, and (iii) a core material that is disposed between the first laminate layer and the second laminate layer; and a die attached to the first laminate layer, the die having an interposer bonded to a surface of an active side of the die, the surface comprising (i) a dielectric material and (ii) a bond pad to route electrical signals of the die, the interposer having a via formed therein, the via being electrically coupled to the bond pad to further route the electrical signals of the die, wherein the die and the interposer are embedded in the core material of the substrate. Other embodiments may be described and/or claimed.

19 Claims, 5 Drawing Sheets

EMBEDDED DIE WITH PROTECTIVE INTERPOSER

CROSS REFERENCE TO RELATED APPLICATIONS

This disclosure claims priority to U.S. Provisional Patent Application No. 61/315,319, filed Mar. 18, 2010, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to techniques, structures, and configurations of an embedded die having a protective interposer.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are generally formed on a die that is coupled to a substrate to form a package assembly. In some emerging packaging techniques, a substrate is formed to embed a die within the substrate. However, the die may include a dielectric material, such as a low-k dielectric, that is susceptible to cracks, delamination, or other yield/reliability defects as a result of stress or other mechanical force. Thus, stress or other mechanical force associated with embedding the die within the substrate may damage the dielectric material resulting in lower yield/reliability of the die.

SUMMARY

In one embodiment, the present disclosure includes a method comprising providing a die having an interposer bonded to a surface of an active side of the die, the surface comprising (i) a dielectric material and (ii) a bond pad to route electrical signals of the die, the interposer having a via formed therein, the via being electrically coupled to the bond pad to further route the electrical signals of the die, attaching the die to a layer of a substrate, and forming one or more additional layers of the substrate to embed the die in the substrate.

In another embodiment, the present disclosure includes a substrate having (i) a first laminate layer, (ii) a second laminate layer, and (iii) a core material that is disposed between the first laminate layer and the second laminate layer and a die attached to the first laminate layer, the die having an interposer bonded to a surface of an active side of the die, the surface comprising (i) a dielectric material and (ii) a bond pad to route electrical signals of the die, the interposer having a via formed therein, the via being electrically coupled to the bond pad to further route the electrical signals of the die, wherein the die and the interposer are embedded in the core material of the substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for a die and interposer embedded in a substrate. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
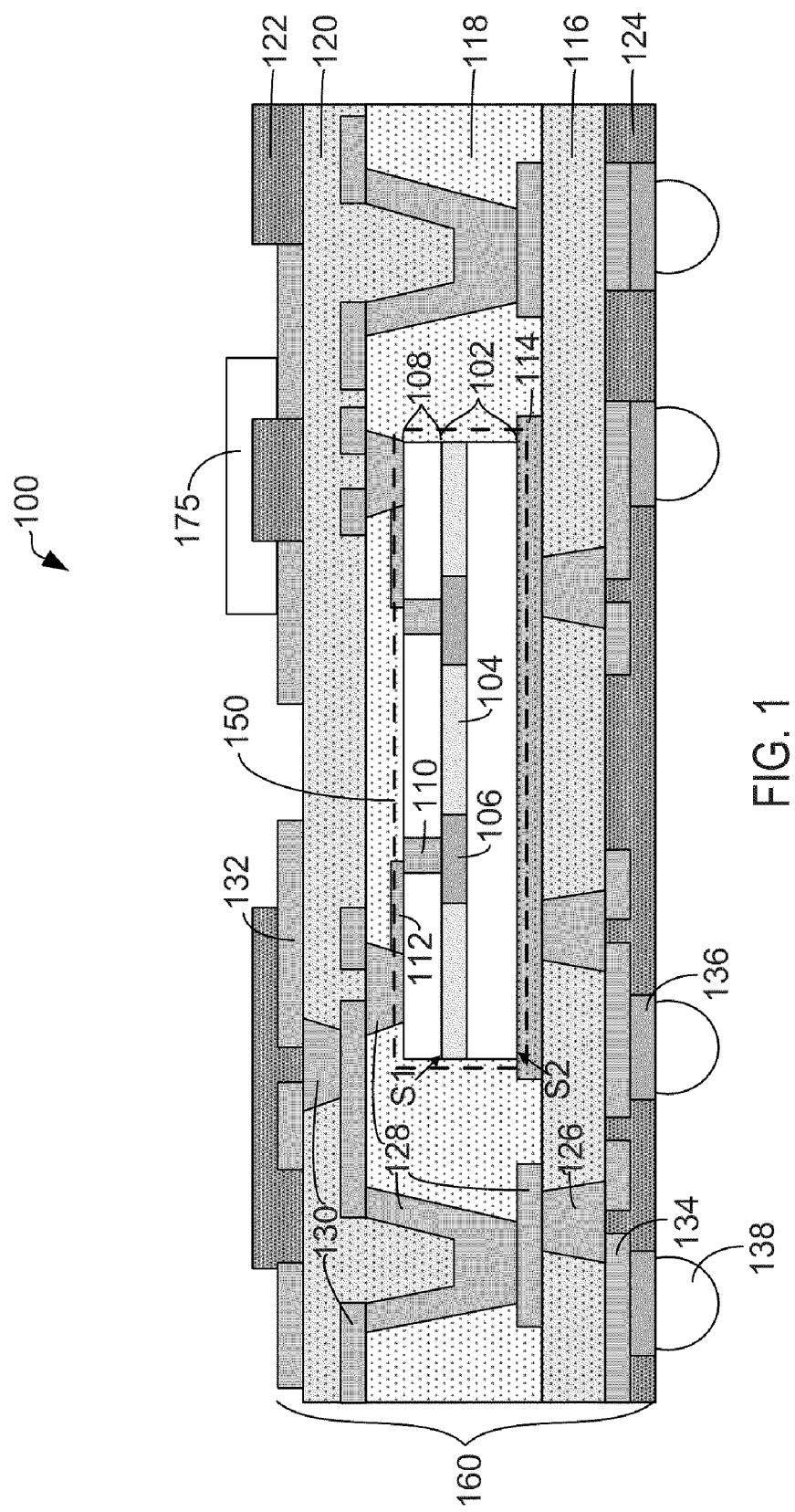
FIG. 1 schematically illustrates an example package assembly using an interposer to protect a die embedded in a substrate.

FIG. 1 schematically illustrates an example package assembly 100 using an interposer 108 to protect a die 102 embedded in a substrate 160. The substrate 160 includes a first laminate layer 116, a second laminate layer 120, and a core material 118 disposed between the first laminate layer 116 and the second laminate layer 120. The first laminate layer 116 and/or the second laminate layer 120 can include a laminate material such as, for example, epoxy/resin based materials. In some embodiments, the laminate material includes Flame Retardant 4 (FR4) or Bismaleimide-Triazine (BT). The core material 118 can include, for example, a resin. In some embodiments, the core material 118 includes a stage B/C thermosetting resin. The materials are not limited to these examples and other suitable materials for the first laminate layer 116, the second laminate layer 120, and/or the core material 118 can be used in other embodiments.

The substrate 160 further includes a first solder mask layer 124 coupled to the first laminate layer 116 and a second solder mask layer 122 coupled to the second laminate layer 120, as shown. The first solder mask layer 124 and the second solder mask layer 122 generally comprise a solder resist material such as, for example, an epoxy. Other suitable materials can be used to fabricate the first solder mask layer 124 and the second solder mask layer 122 in other embodiments.

The substrate 160 further includes routing structures 126, 128, 130, 132, and 134 respectively disposed in the first laminate layer 116, the core material 118, the second laminate layer 120, the second solder mask layer 122, and the first solder mask layer 124. The routing structures 126, 128, 130, 132, and 134 generally comprise an electrically conductive material, e.g., copper, to route electrical signals of the die 102. The electrical signals of the die 102 can include, for example, input/output (I/O) signals and/or power/ground for integrated circuit (IC) devices (not shown) formed on the die 102.

As shown, the routing structures 126, 128, 130, 132, and 134 can include line-type structures to route the electrical signals within a layer of the substrate 160 and/or via-type structures to route the electrical signals through a layer of the substrate 160. The routing structures 126, 128, 130, 132, and 134 can include other configurations than depicted in other embodiments. While a particular configuration has been described and shown for the substrate 160, other substrates that use three-dimensional (3D) packaging methods to embed one or more dies can benefit from the principles described herein.

The die 102 and the interposer 108 are embedded in the substrate 160, as shown. According to various embodiments, the die 102 and the interposer 108 are embedded in the core material 118 between the first laminate layer 116 and the second laminate layer 120.

The die 102 comprises a semiconductor material, such as silicon, and generally includes IC devices (not shown), such as transistors for logic and/or memory or other circuitry, formed on an active side S1 of the die 102. An inactive side S2 of the die 102 is disposed opposite to the active side S1 of the die 102. The active side S1 and the inactive side S2 generally refer to opposing surfaces of the die 102 to facilitate the description of various configurations described herein and are not intended to be limited to a particular structure of the die 102.

In some embodiments, a surface on the inactive side S2 of the die 102 is attached to the first laminate layer 116 using an adhesive 114 such as, for example, a resin. The die 102 can be coupled to the first laminate layer 116 using other techniques, such as using a carrier group, in other embodiments.

The active side S1 of the die 102 has a surface comprising a dielectric material 104. In some embodiments, the dielectric material 104 includes a low-k dielectric material having a dielectric constant that is smaller than a dielectric constant of silicon dioxide. Low-k dielectric materials, such as those that are used to fabricate dies that include features having a size of about 40 nanometers or less, may generally have material properties that are more susceptible to structural defects from process-related stresses than non-low-k dielectric materials.

According to various embodiments, the dielectric material 104 includes silicon dioxide doped with materials such as carbon or fluorine. The dielectric material 104 can include other low-k dielectric materials in other embodiments.

The surface on the active side S1 of the die 102 further comprises one or more bond pads 106 or analogous structures to route the electrical signals of the die 102. The one or more bond pads 106 generally comprise an electrically conductive material such as, for example, aluminum or copper. Other suitable materials can be used in other embodiments.

The die 102 can include one or more dies in some embodiments. For example, the die 102 can be part of a system-on-a-chip (SOC) or a multi-chip module (MCM) configuration.

The interposer 108 is coupled to the surface of the die 102 (e.g., on the active side S1) having the dielectric material 104 and the one or more bond pads 106, as shown. The interposer 108 generally includes one or more vias 110 formed in a semiconductor material such as silicon. In some embodiments, the one or more vias 110 include through-silicon vias (TSVs), which pass completely through the interposer 108, as shown. The one or more vias 110 are electrically coupled to the one or more bond pads 106 and are generally filled with an electrically conductive material, e.g., copper, to further route the electrical signals of the die 102.

The interposer 108 can be bonded to the die 102 using, for example, a thermal compression process or solder reflow process. In some embodiments, a metal or solder material that is coupled to the one or more vias 108 is bonded to a metal or solder material disposed on the active side S1 of the die 102. For example, thermal compression can be used to form a metal-metal bond between the interposer 108 and the die 102 such as, for example, copper-to-copper, gold-to-copper, or gold-to-gold. Solder reflow can be used to form a solder bond such as, for example, solder-to-solder or solder-to-metal. A variety of structures can be used to form the bond such as, for example, bumps, pillars, and pads (e.g., the one or more bond pads 106) including redistribution layer (RDL) pad configurations. Other suitable materials, structures, and/or bonding techniques can be used in other embodiments.

In some embodiments, the die 102 and the interposer 108 both comprise a material (e.g., silicon) having the same or similar coefficient of thermal expansion (CTE). Using a material having the same or similar CTE for the die 102 and the interposer 108 reduces stress associated with heating and/or cooling mismatch of the materials.

According to various embodiments, the interposer 108 is configured to protect the dielectric material 104 of the die 102 from cracking or other defects associated with embedding the die 102 in the substrate 160. For example, the formation of one or more layers (e.g., deposition of the core material 118) to embed the die 102 in the substrate 160 can produce stresses that cause structural defects in the dielectric material 104 of the die. The interposer 108 provides a physical buffer, support, and strengthening agent to the die 102 (e.g., the dielectric material 104), particularly during the formation of the one or more layers to embed the die 102 in the substrate 160. That is, the die 102 coupled to the interposer 108 as described herein provides a protected integrated circuit structure 150 that is more structurally resilient to stresses associated with fabricating the substrate 160 than the die 102 alone, resulting in improved yield and reliability of the die 102. Although embodiments have been generally described in connection with the substrate 160 shown in FIG. 1, other substrate configurations that benefit from these principles are included in the scope of the present disclosure.

The routing structures 126, 128, 130, 132, and 134 are electrically coupled to the one or more vias 110 to further route the electrical signals of the die 102 throughout the substrate 160. For example, the one or more vias 110 can be electrically coupled to the routing structures 128 that are disposed in a region of the core material 118 using a fan-out, fan-in, or straight-up connection. In some embodiments, a redistribution layer 112 comprising an electrically conductive material, e.g., copper, is formed on the interposer 108 to route the electrical signals between the one or more vias 110 and the routing structures 128. The routing structures 126, 128, 130, 132, and 134 can be used to provide electrical connections for the electrical signals of the die 102 on opposing surfaces of the substrate 160, as shown.

Additional structures can be formed to further route the electrical signals of the die 102. For example, one or more bond pads 136 can be formed on a surface of the substrate 160. In the depicted embodiment, the one or more bond pads 136 are disposed in the first solder mask layer 124 and electrically coupled to the one or more vias 110. Although not depicted, one or more bond pads can be formed in the second solder mask layer 122 in other embodiments. The one or more bond pads 136 generally comprise an electrically conductive material such as copper or aluminum. Other electrically conductive materials can be used to form the one or more bond pads 136 in other embodiments.

In some embodiments, one or more solder balls 138 or analogous package interconnect structures are formed on the one or more bond pads 136 to facilitate electrical coupling of the package assembly 100 with other electrical components, e.g., a printed circuit board such as a motherboard. According to various embodiments, the package assembly 100 is a ball-grid array (BGA) package. The package assembly 100 can include other types of packages in other embodiments.

Passive or active devices can be coupled to the substrate 160. For example, in FIG. 1, a passive device 175 (e.g., a capacitor) is electrically coupled to the routing structures 132 disposed in the second solder mask layer 122. Other types of passive and/or active devices can be electrically coupled to the substrate 160 in other embodiments.

Figure 2:
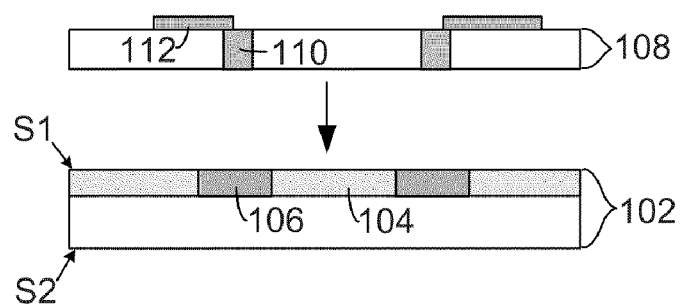
FIG. 2 schematically illustrates a die and an interposer prior to being coupled together.

FIG. 2 schematically illustrates a die 102 and an interposer 108 prior to being coupled together. The die 102 and the interposer 108 may comport with embodiments already described in connection with FIG. 1.

The die 102 can be fabricated using well-known semiconductor manufacturing techniques. For example, the die 102 can be formed on a wafer with multiple other dies where one or more IC devices (not shown), such as transistors, are formed on the active side S1 of the die 102. The dielectric material 104 and the one or more bond pads 106 are generally formed on a surface on the active side S1 of the die 102. The wafer can be singulated to provide the die 102 in singulated form.

The interposer 108 can likewise be fabricated using well-known semiconductor manufacturing techniques. Similar to the die 102, the interposer 108 can be formed on a wafer with multiple other interposers. One or more vias 110 such as, TSVs, can be formed through the interposer 108 and/or a redistribution layer 112 can be formed on a surface of the interposer 108. The wafer can be singulated to provide the interposer 108 in singulated form.

The die 102 and the interposer 108 can be bonded together in singulated or wafer form, or combinations thereof, according to a variety of techniques. For example, the interposer 108 can be singulated and bonded to the die 102 in wafer form, or vice versa.

According to various embodiments, the interposer 108 is bonded to the die 102 using a thermal compression process or a solder reflow process as described herein. That is, one or more electrically conductive structures (e.g., pillars, bumps, pads, redistribution layer) are formed on the interposer 108 and the die 102 to form a bond between the interposer 108 and the die 102. The one or more bond pads 106 of the die 102 can be electrically coupled to the one or more vias 110 of the interposer 108 using any suitable thermal compression process or solder reflow process to form a bond between the one or more electrically conductive structures. The interposer 108 is bonded to the surface of the die 102 (e.g., on the active side S1) having the dielectric material 104 and the one or more bond pads 106 disposed thereon, as indicated by the arrow.

Figure 3:
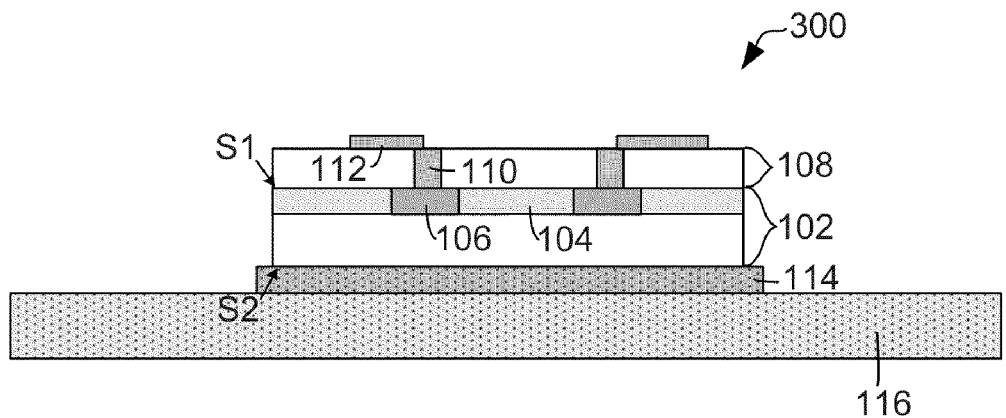
FIG. 3 schematically illustrates a package assembly subsequent to attaching a die and an interposer to a layer of a substrate.

FIG. 3 schematically illustrates a package assembly 300 subsequent to attaching a die 102 and an interposer 108 to a layer of a substrate (e.g., the substrate 160 of FIG. 1). In some embodiments, the layer of the substrate is a first laminate layer 116. The first laminate layer 116 may comport with embodiments already described in connection with FIG. 1.

The die 102 can be attached to the first laminate layer 116 using an adhesive 114 to couple the inactive side S2 of the die 102 to the first laminate layer 116. The adhesive 114 may comport with embodiments already described in connection with FIG. 1. The die 102 can be attached to the layer of the substrate using other techniques (e.g., a carrier group) in other embodiments.

Figure 4:
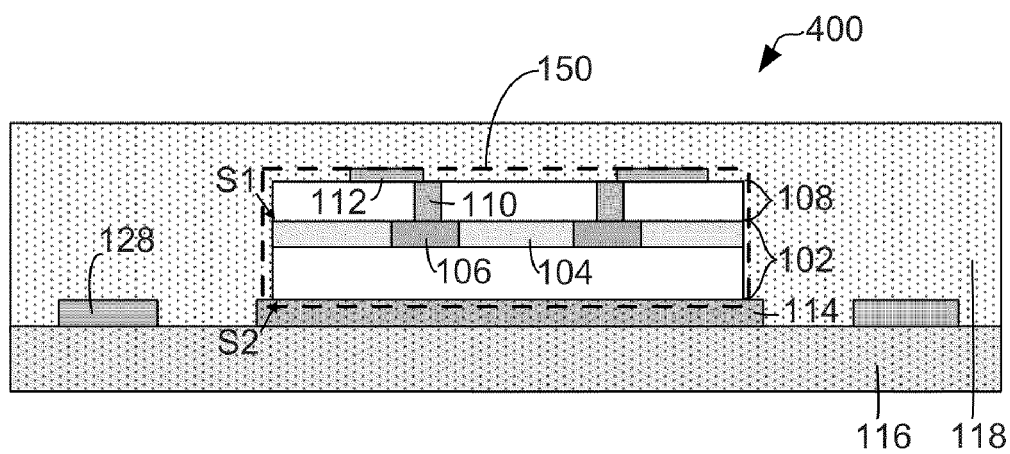
FIGS. 4-8 schematically illustrate a package assembly subsequent to forming one or more additional layers of the substrate to embed the die in the substrate.

FIGS. 4-8 schematically illustrate a package assembly subsequent to forming one or more additional layers of the substrate to embed the die in the substrate. Package assembly 400 of FIG. 4 represents the package assembly 300 of FIG. 3 subsequent to forming a core material 118 of the substrate (e.g., the substrate 160 of FIG. 1). The core material 118 may comport with embodiments already described in connection with FIG. 1.

The core material 118 can be deposited to encapsulate the die 102 and the interposer 108 as shown. For example, the core material 118 can be formed by depositing a thermosetting resin into a mold.

According to some embodiments, the interposer 108 is disposed to protect the dielectric material 104 of the die 102 from stress associated with deposition of the core material 118. The interposer 108 on the die 102 forms a protected IC structure 150 as described in connection with FIG. 1.

In some embodiments, routing structures 128 are formed on the first laminate layer 116 prior to depositing the core material 118. The routing structures 128 can be formed on the first laminate layer 116 prior to attaching the die 102 to the first laminate layer 116. The routing structures 128 may comport with embodiments already described in connection with FIG. 1.

Figure 5:
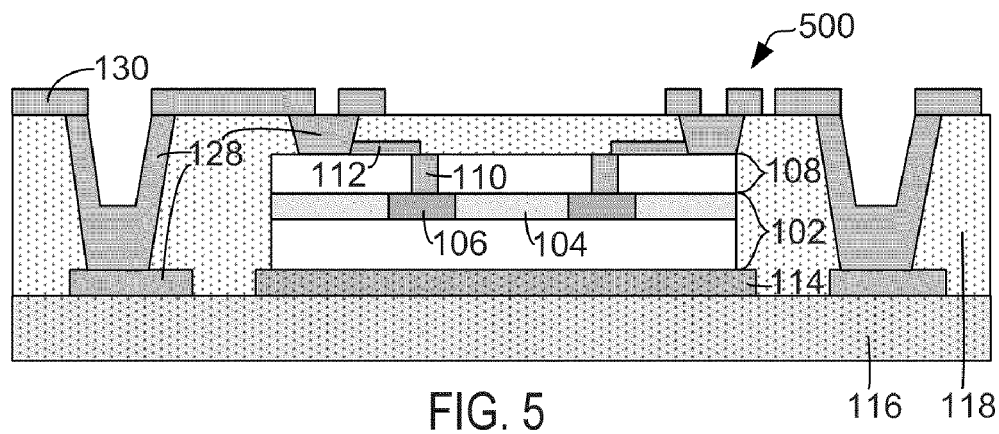
Figure 6:
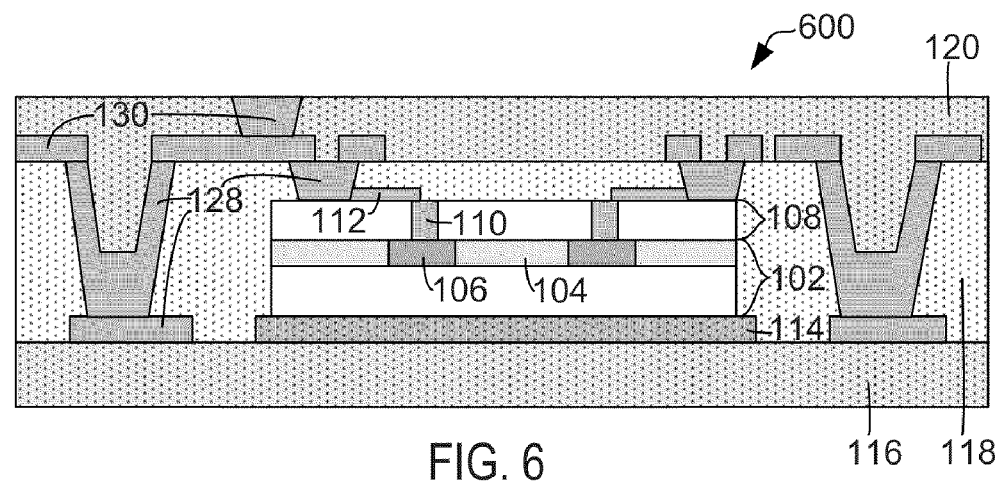
Figure 7:
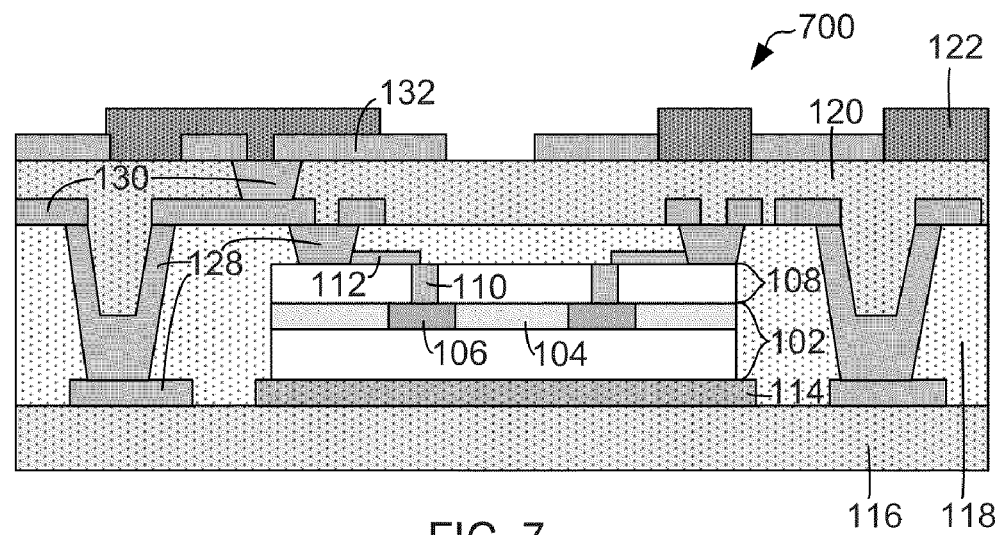
Figure 8:
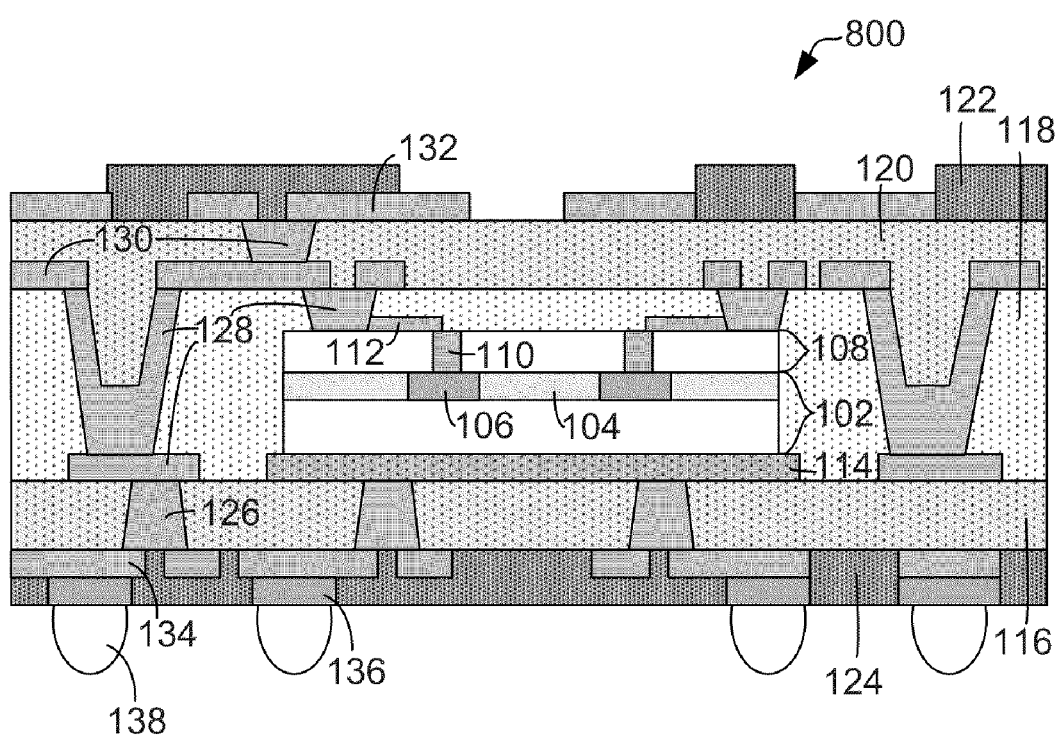

Package assembly 500 of FIG. 5 represents the package assembly 400 of FIG. 4 subsequent to patterning the core material 118 and forming additional routing structures 128, as shown, and routing structures 130. The routing structures 130 may comport with embodiments already described in connection with FIG. 1.

The core material 118 can be patterned using any suitable process, e.g., lithography/etch or laser-drilling, to remove portions of the core material 118. Portions of the core material 118 are removed to allow deposition of an electrically conductive material to form the routing structures 128,130. For example, the core material 118 can be patterned to facilitate formation of an electrical connection with the one or more vias 110 of the interposer 108 through the core material 118. The electrical connection can be formed, for example, by depositing an electrically conductive material to form the routing structures 128, 130 that are electrically coupled to the one or more vias 110 through the redistribution layer 112, as shown.

Package assembly 600 represents the package assembly 500 subsequent to forming a second laminate layer 120 one the core material 118. The second laminate layer 120 may comport with embodiments already described in connection with FIG. 1.

The second laminate layer 120 can be formed by depositing a laminate material on the core material 118 and patterning the laminate material to facilitate formation of an electrical connection with the one or more vias 110 of the interposer 108 through the laminate material. For example, an electrically conductive material can be deposited into the patterned areas of the second laminate layer 120 where the laminate material has been removed to form additional routing structures 130, as shown. The routing structures 130 provide an electrical connection to the one or more vias 110 through the second laminate layer 120.

Package assembly 700 represents the package assembly 600 subsequent to forming a solder mask layer (e.g., the second solder mask layer 122 of FIG. 1) on the second laminate layer 120. The second solder mask layer 122 may comport with embodiments described in connection with FIG. 1.

Routing structures 132 can be formed by deposition and/or patterning of an electrically conductive material on the second laminate layer 120. The routing structures 132 may comport with embodiments described in connection with FIG. 1. A solder resist material can be deposited and/or patterned to form the second solder mask layer 122. The solder resist material can be formed such that some of the routing structures 132 are exposed for further electrical connection.

Package assembly 800 represents the package assembly 700 subsequent to forming routing structures 126 in the first laminate layer 116 and subsequent to forming a solder mask layer (e.g., the first solder mask layer 124 of FIG. 1) on the first laminate layer 116. The first solder mask layer 124, one or more bond pads 136, one or more solder balls 138, and routing structures 126, 134 may comport with embodiments described in connection with FIG. 1.

In some embodiments, the first laminate layer 116 is patterned to facilitate formation of an electrical connection with the one or more vias 110 of the interposer 108 through the first laminate layer 116. An electrically conductive material can be deposited into the patterned portions of the first laminate layer to form the routing structures 126 that provide the electrical connection with the one or more vias 110.

The routing structures 134 are formed on the first laminate layer 116 and electrically coupled to the routing structures 126 to route the electrical signals of the die 102. The one or more bond pads 136 are formed on the routing structures 126. A solder resist material is deposited and/or patterned to form the solder mask layer 124. Openings may be formed in the solder resist material to allow formation/placement of solder balls 138 on the one or more bond pads 134.

Figure 9:
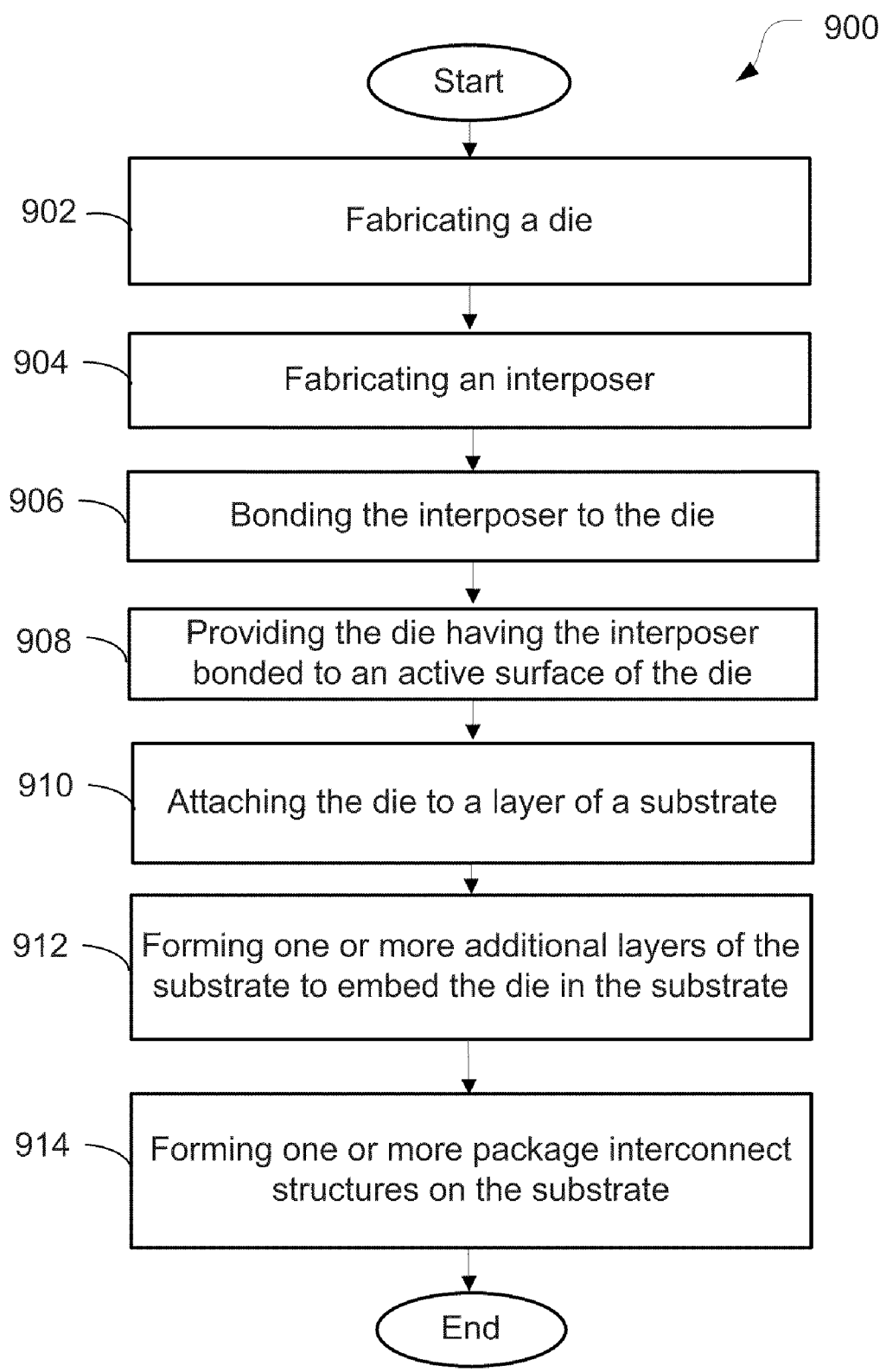
FIG. 9 is a process flow diagram of a method to fabricate a package assembly described herein.

FIG. 9 is a process flow diagram of a method 900 to fabricate a package assembly (e.g., the package assembly 100 of FIG. 1) described herein. The method 900 may comport with embodiments described in connection with FIGS. 1-8.

At 902, the method 900 includes fabricating a die (e.g., the die 102 of FIG. 1). The die can be fabricated using well-known semiconductor manufacturing techniques. A surface on an active side (e.g., the active side S1 of FIG. 1) of the die is fabricated to include a dielectric material (e.g., the dielectric material 104 of FIG. 1) and a bond pad (e.g., the one or more bond pads 106 of FIG. 1) or analogous structure to route electrical signals of the die.

At 904, the method 900 further includes fabricating an interposer (e.g., the interposer 108 of FIG. 1). The interposer can be fabricated using well-known semiconductor manufacturing techniques. The interposer is fabricated to include a via (e.g., the one or more vias 110 of FIG. 1) formed therein.

At 906, the method 900 further includes bonding the interposer to the die. The interposer can be bonded to the die using, for example, a thermal compression process or a solder reflow process. In some embodiments, the bonding process forms a bond that electrically couples the via of the interposer and the bond pad of the die. The interposer can be coupled to the die using, for example, bumps, pillars, pads or the like to form an electrically conductive bond between the interposer and the die.

At 908, the method 900 further includes providing the die having the interposer bonded to a surface of the active side of the die. In some embodiments, the surface of the die includes a dielectric material and a bond pad to route electrical signals of the die. The interposer has a via that is electrically coupled to the bond pad to further route the electrical signals of the die.

At 910, the method 900 further includes attaching the die to a layer (e.g., the first laminate layer 116 of FIG. 1) of a substrate (e.g., the substrate 160 of FIG. 1). For example, the die can be attached to the layer of the substrate using an adhesive or a carrier group.

At 912, the method 900 further includes forming one or more additional layers of the substrate to embed the semiconductor die in the substrate. The interposer is disposed to protect the dielectric material of the die from stress associated with forming the one or more additional layers.

Forming the one or more additional layers of the substrate includes forming a core (e.g., the core material 118 of FIG. 1) of the substrate. The core can be formed by depositing a core material, such as a resin, to encapsulate the die and the interposer. Portions of the core material are removed (e.g., by patterning) or openings in the core material are otherwise provided to facilitate formation of an electrical connection with the via of the interposer through the core material. For example, an electrically conductive material can be deposited in patterned portions of the core material to provide the electrical connection (e.g., the routing structures 128 of FIG. 1).

Forming the one or more additional layers of the substrate can further include forming a layer on the core material. In some embodiments, a laminate layer (e.g., the second laminate layer 120 of FIG. 1) is formed by depositing a laminate material on the core material. Portions of the laminate material can be removed (e.g., by patterning) or openings can be otherwise provided in the laminate layer to facilitate formation of an electrical connection with the via of the interposer through the laminate material. For example, an electrically conductive material can be deposited in patterned portions of the laminate material to provide the electrical connection (e.g., the routing structures 130 of FIG. 1).

Forming the one or more additional layers can further include forming a solder mask layer (e.g. the second solder mask layer 122 of FIG. 1) on the laminate material that is deposited on the core material. The solder mask layer can be formed by depositing and/or patterning an electrically conductive material to form routing structures (e.g., the routing structures 132 of FIG. 1) and depositing and/or patterning a solder resist material to allow further electrical connections with the routing structures. For example, a passive device (e.g., the passive device 175 of FIG. 1) can be electrically coupled to the routing structures.

Forming the one or more additional layers can further include removing portions (e.g., by patterning) of the laminate material of the layer (e.g., the first laminate layer 116 of FIG. 1) of the substrate or otherwise providing openings in the laminate material to facilitate formation of an electrical connection with the via of the interposer through the layer of the substrate. An electrically conductive material can be deposited into the removed portions or the openings to form the electrical connection (e.g., the routing structures 126 of FIG. 1).

Forming the one or more additional layers can further include forming a solder mask layer (e.g., the first solder mask layer 124 of FIG. 1) on the layer of the substrate. The solder mask layer can be formed by depositing and/or patterning an electrically conductive material to form routing structures (e.g., the routing structures 134 of FIG. 1) and depositing and/or patterning a solder resist material to allow further electrical connections. One or more bond pads (e.g., the one or more bond pads 136) can be formed on the routing structures.

At 914, the method 900 further includes forming one or more package interconnect structures on the substrate. The one or more package interconnect structures can include, for example, solder balls (e.g., the solder balls 118) or any other analogous structures that further routes the electrical signals of the die for the package assembly (e.g., the package assembly 100 of FIG. 1). In an embodiment, solder balls are attached to the one or more bond pads of the solder mask layer to further route the electrical signals of the die.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
a substrate having (i) a first laminate layer, (ii) a second laminate layer, (iii) a core material that is disposed between the first laminate layer and the second laminate layer, (iv) a first solder mask layer that is coupled to the first laminate layer, and (v) a second solder mask layer that is coupled to the second laminate layer; and
a die attached to the first laminate layer, the die having an interposer bonded to a surface of an active side of the die, the surface comprising (i) a dielectric material and (ii) a bond pad to route electrical signals of the die, wherein the interposer has a via formed therein, wherein the via is electrically coupled to the bond pad to further route the electrical signals of the die, and wherein the die and the interposer are embedded in the core material of the substrate.

2. The apparatus of claim 1, wherein:
the die comprises silicon and the interposer comprises silicon;
the via of the interposer comprises a through-silicon via (TSV);
the dielectric material of the die is a low-k dielectric material;
the bond pad of the die comprises aluminum or copper;
the core material of the substrate comprises a resin; and
the interposer is bonded to the die using a metal-metal bond or a solder bond.

3. The apparatus of claim 1, wherein:
the die is attached to the first laminate layer using an adhesive to couple an inactive side of the die to the first laminate layer; and
the inactive side of the die is disposed opposite to the active side of the die.

4. The apparatus of claim 1, further comprising:
one or more routing structures that are electrically coupled to the via of the interposer to further route the electrical signals of the die through the core material, the first laminate layer, and the second laminate layer.

5. The apparatus of claim 4, wherein the one or more routing structures are electrically coupled to the via of the interposer using a redistribution layer formed on the interposer.

6. The apparatus of claim 4, wherein the one or more routing structures comprise copper.

7. The apparatus of claim 1, wherein the substrate further comprises:
a bond pad (i) disposed in the first solder mask layer and (ii) electrically coupled to the via of the interposer to further route the electrical signals of the die.

8. The apparatus of claim 7, further comprising:
a solder ball coupled to the bond pad that is disposed in the first solder mask layer, the solder ball to further route the electrical signals of the die.

9. The apparatus of claim 8, wherein the substrate comprises a ball-grid array (BGA) substrate.

10. A method comprising:
forming a substrate comprising (i) a first laminate layer, (ii) a second laminate layer, (iii) a core material that is disposed between the first laminate layer and the second laminate layer of a substrate, (iv) a first solder mask layer that is coupled to the first laminate layer, and (v) a second solder mask layer that is coupled to the second laminate layer; and
attaching a die to the first laminate layer, the die having an interposer bonded to a surface of an active side of the die, the surface comprising (i) a dielectric material and (ii) a bond pad to route electrical signals of the die, wherein the interposer has a via formed therein, wherein the via is electrically coupled to the bond pad to further route the electrical signals of the die, and wherein the die and the interposer are embedded in the core material of the substrate.

11. The method of claim 10, further comprising:
fabricating the die;
fabricating the interposer; and
bonding the interposer to the surface of the active side of the die.

12. The method of claim 10, wherein:
the die comprises silicon and the interposer comprises silicon;
the via of the interposer comprises a through-silicon via (TSV);
the dielectric material of the die is a low-k dielectric material;
the bond pad of the die comprises aluminum or copper;
the core material of the substrate comprises a resin; and
the interposer is bonded to the die using a metal-metal bond or a solder bond.

13. The method of claim 10, wherein:
the die is attached to the first laminate layer using an adhesive to couple an inactive side of the die to the first laminate layer; and
the inactive side of the die is disposed opposite to the active side of the die.

14. The method of claim 10, further comprising:
   forming one or more routing structures, to be electrically coupled to the via of the interposer to further route the electrical signals of the die through the core material, the first laminate layer, and the second laminate layer.

15. The method of claim 14, further comprising:
   forming a redistribution layer on the interposer such that the one or more routing structures are electrically coupled to the via of the interposer through the redistribution layer.

16. The method of claim 14, wherein the one or more routing structures comprise copper.

17. The method of claim 10, further comprising:
   forming a bond pad, wherein the bond pad is (i) disposed in the first solder mask layer, and (ii) electrically coupled to the via of the interposer to further route the electrical signals of the die.

18. The method of claim 17, further comprising:
   attaching a solder ball to the bond pad that is disposed in the first solder mask layer, wherein the solder ball further routes the electrical signals of the die.

19. The method of claim 18, wherein the solder ball is a part of the substrate comprising a ball-grid array (BGA) substrate.

* * * * *